(12) United States Patent
Tsai

(10) Patent No.: US 7,120,815 B2
(45) Date of Patent: Oct. 10, 2006

(54) CLOCK CIRCUITRY ON PLURAL INTEGRATED CIRCUITS

(75) Inventor: Li Tsai, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 490 days.

(21) Appl. No.: 10/697,297

(22) Filed: Oct. 31, 2003

(65) Prior Publication Data

US 2005/0097381 A1 May 5, 2005

(51) Int. Cl.
G06F 1/12 (2006.01)
G06F 13/42 (2006.01)
(52) U.S. Cl. ...................... 713/400; 713/401
(58) Field of Classification Search ................ 713/400, 713/401
See application file for complete search history.

(56) References Cited

U.S. PATENT DOCUMENTS 6,005,428 A * 12/1999 Amdahl ...................... 327/161
2002/0116656 A1 * 8/2002 Lee et al. ................... 713/500
2004/0130367 A1 * 7/2004 Swarbrick et al. .......... 327/165

* cited by examiner

Primary Examiner—Lynne H. Browne
Assistant Examiner—Stefan Stoynov

(57) ABSTRACT

Clock circuitry supplies synchronized clock waves to loads on plural integrated circuit chips. The clock circuitry couples the synchronized clock waves to regions of the chips. There is a first clock wave route in a first direction from a first chip to a second chip and a second clock wave route in a second direction from the second chip to the first chip. The routes have substantially the same geometry and are in close proximity to each other so they have substantially the same effects on clock waves propagating therein in opposite directions. A phase detector and lowpass filter on the first chip responds to (1) a clock wave source and (2) a clock wave derived on a chip other than the first chip, to supply, via a common mode line, a control for voltage controlled delays of the chips other than the third chip.

17 Claims, 7 Drawing Sheets

CLOCK CIRCUITRY ON PLURAL INTEGRATED CIRCUITS

FIELD OF THE INVENTION

The present invention relates generally to clock circuitry and more particularly to clock circuitry on plural integrated circuits.

BACKGROUND OF THE INVENTION

Commonly assigned U.S. Pat. No. 6,594,772, issued Jul. 15, 2003, of which I am a co-inventor, discloses a single integrated circuit chip having clock circuitry for supplying clock waves to many loads on the chip. The chip includes several clock node circuits at different locations on the chip and clock coupling circuitry connected between a clock wave output and input of adjacent clock nodes. Each clock node circuit and the clock coupling circuitry are arranged for maintaining a predetermined phase relation between the clock wave output and input of adjacent clock nodes.

In one embodiment, the clock node circuits and the clock coupling circuits include feedback arrangements for maintaining the predetermined phase relation. The clock wave inputs and outputs of the nodes are connected so there is no direct feedback from the clock wave outputs and inputs of any of the different clock nodes.

In another embodiment, circuitry connected to be responsive to the clock waves at spatially displaced first and second nodes on the chip (a) compares the relative phases of the clock waves at the spatially displaced nodes, and (b) derives a signal.

Clock waves derived at disparate locations on the single integrated circuit chip of the co-pending application have substantially the same phase, or have predictable, stable phase differences. One embodiment of the device of the co-pending application is particularly adapted for use on a single relatively large integrated circuit e.g., 2 centimeters on a side, operating at a high clock frequency e.g., more than 1.0 gigahertz (GHz), wherein effects of semiconductor processing, as well as temperature and voltage variations as a function of time and/or space are minimized. The circuitry of the co-pending application is particularly adapted for resolving problems associated with clock skew. Circuitry for deriving the signal indicative of clock skew quality of the chip clock circuitry includes: (a) an additional clock node, (b) an additional coupling circuit responsive to a clock wave at the first node, and (c) a phase detector arrangement. The additional clock node responds to a clock wave derived from the additional coupling circuit. The phase detector arrangement responds to a clock wave at the second node and the clock wave output of the additional node to derive the clock skew quality signal.

Another aspect of the previously mentioned patent relates to clock circuitry for supplying clock waves to many loads on a single integrated circuit chip, wherein the clock circuitry includes several clock nodes at different locations on the chip and clock coupling circuitry connected between adjacent clock nodes. Each clock node includes (a) a clock wave input, (b) a clock wave output and (c) feedback circuitry for maintaining a predetermined phase relation between clock waves at the clock wave input and clock wave output of the particular node. The clock coupling circuitry maintains a predetermined phase relation between the output and input of the adjacent clock nodes on the single chip.

In the previously mentioned patent, clock circuitry for supplying clock waves to many loads on a single integrated circuit chip comprises several clock nodes at different locations on the chip and clock coupling circuitry connected between a clock wave output and input of adjacent clock nodes. Each clock node includes an arrangement for maintaining a predetermined phase relation between clock waves at the clock wave input and clock wave output of the particular node. Each clock coupling circuit includes a feedback loop for maintaining a predetermined phase relation between the clock wave output of a first of the adjacent nodes and the clock wave input of a second of the adjacent nodes.

I have now realized that many of the principles of the previously mentioned patent are applicable, with modification, to arrangements including plural integrated circuit chips having interconnected clock circuitry.

SUMMARY OF THE INVENTION

According to the present invention, clock circuitry supplies synchronized clock waves to loads on plural integrated circuit chips. The clock circuitry is on the chips and adapted to be responsive to a source of clock waves. The clock circuitry is arranged for coupling the synchronized clock waves to regions of the plural chips. First and second routes for the clock waves are between pairs of the chips. The first and second routes and the chips are arranged so there is a first clock wave route in a first direction from a first chip of a particular pair to a second chip of that particular pair and a second clock wave route in a second direction from the second chip of the particular pair to the first chip of the particular pair. The first and second routes have substantially the same geometry and are in close proximity to each other so they have substantially the same effects on clock waves propagating therein in opposite directions. Circuitry maintains a substantially constant phase relation between the clock waves transmitted to and from the first chip via the first and second routes.

In one embodiment the circuitry is on the first chip.

In a second embodiment the circuitry is a third chip different from the first and second chips and the circuitry is arranged for deriving a control signal for maintaining the substantially constant phase relation. Signal transmission elements, e.g. lead lines, couple the signal from the third chip to the first and second chips.

Preferably, the signal transmission elements include a common mode path for the control signal between the third chip and the first and second chips.

The circuitry in both embodiments preferably includes a phase detector responsive to a pair of clock waves. The phase detector preferably derives a signal indicative of the phase difference of the pair of clock waves. The signal from another chip preferably controls variable delay circuits for the clock waves.

In the first embodiment, the phase detector and circuitry responsive to the signal the phase detector derives to control synchronization is on the individual chips. In the second embodiment the phase detector is preferably on only one chip and the circuitry responsive to the signal the phase detector derives is on the plural chips. The signal the phase detector derives is preferably coupled to the chips by common mode circuitry. The common mode circuitry prevents anomalies and/or the effects from causing erroneous operation of the circuitry driven by the phase detector. The anomalies and other effects result from voltage and temperature variations, as well as unintended differences of the components resulting from differences in materials and manufacturing steps of the chips.

The chips and routes can be carried by a printed circuit board. Alternatively, the chips can be stacked on each other and the routes established by vias between the stacked chips.

In one arrangement, the routes connect the chips in sequence such that route 1 connects chip 1 to chip 2, route 2 connects chip 2 to chip 3, . . . route k connects chip k to chip (k+1) . . . route (N−1) connects chip (N−1) to the last chip of the sequence, i.e. chip N.

In another arrangement, the routes connect the chips in a star configuration.

DETAILED DESCRIPTION OF THE DRAWING

Figure 1:
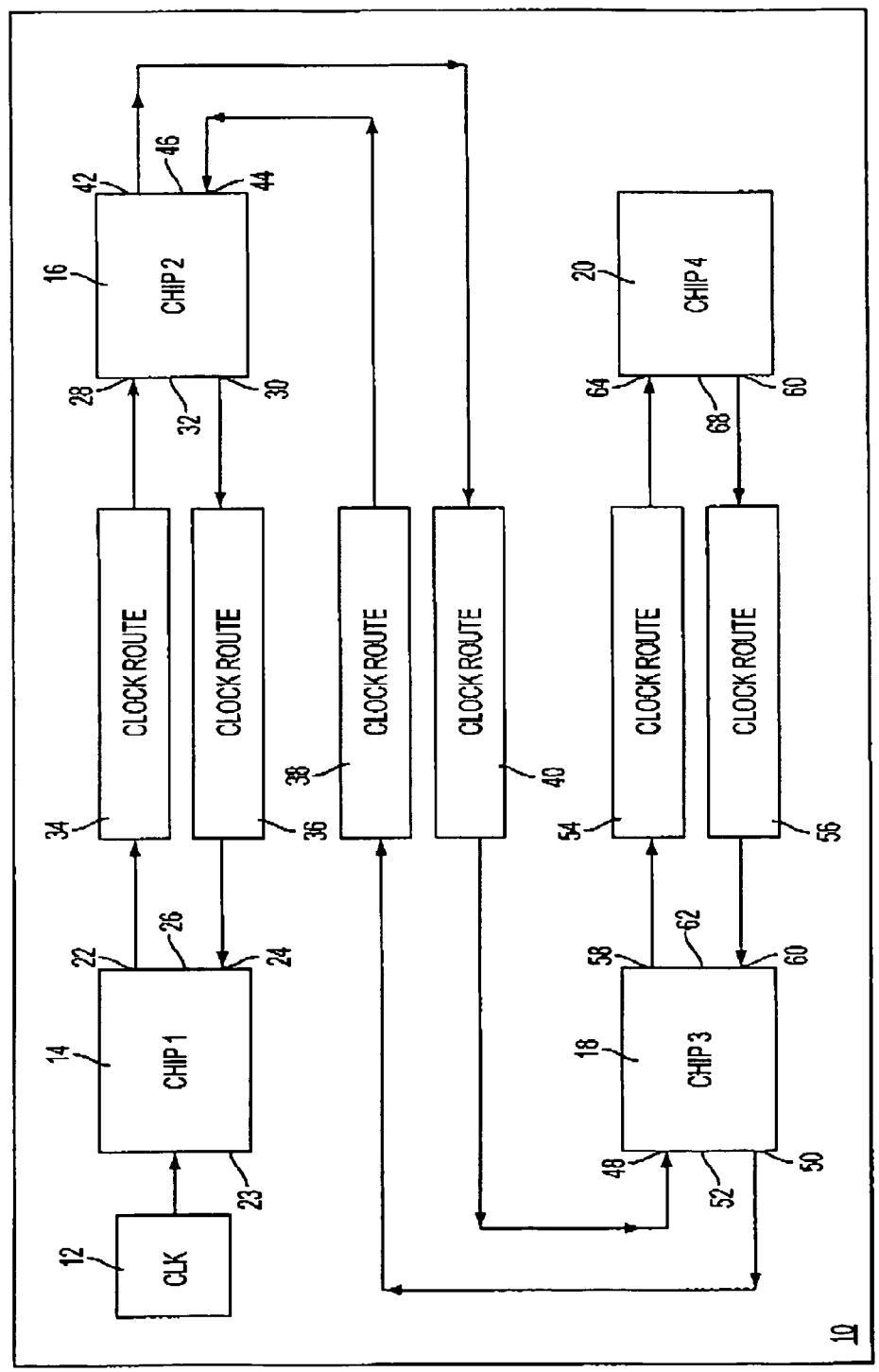
FIG. 1 is a block diagram of an embodiment of the invention wherein a printed circuit board carries clock routes connecting four chips that are sequentially responsive to clock waves.

Reference is now made to FIG. 1 of the drawing, wherein printed circuit board 10 is illustrated as carrying clock source 12, integrated circuit chips 14, 16, 18 and 22, as well as balanced clock routes 34, 36, 38, 40, 54 and 56 that connect adjacent pairs of the chips together, to assist in maintaining clock waves on each of chips 14–20 synchronized. While clock source 12 is illustrated as being mounted on printed circuit board 10, externally of the chips, it is to be understood that the clock source can be incorporated into one of the chips, in particular chip 14.

Figure 2:
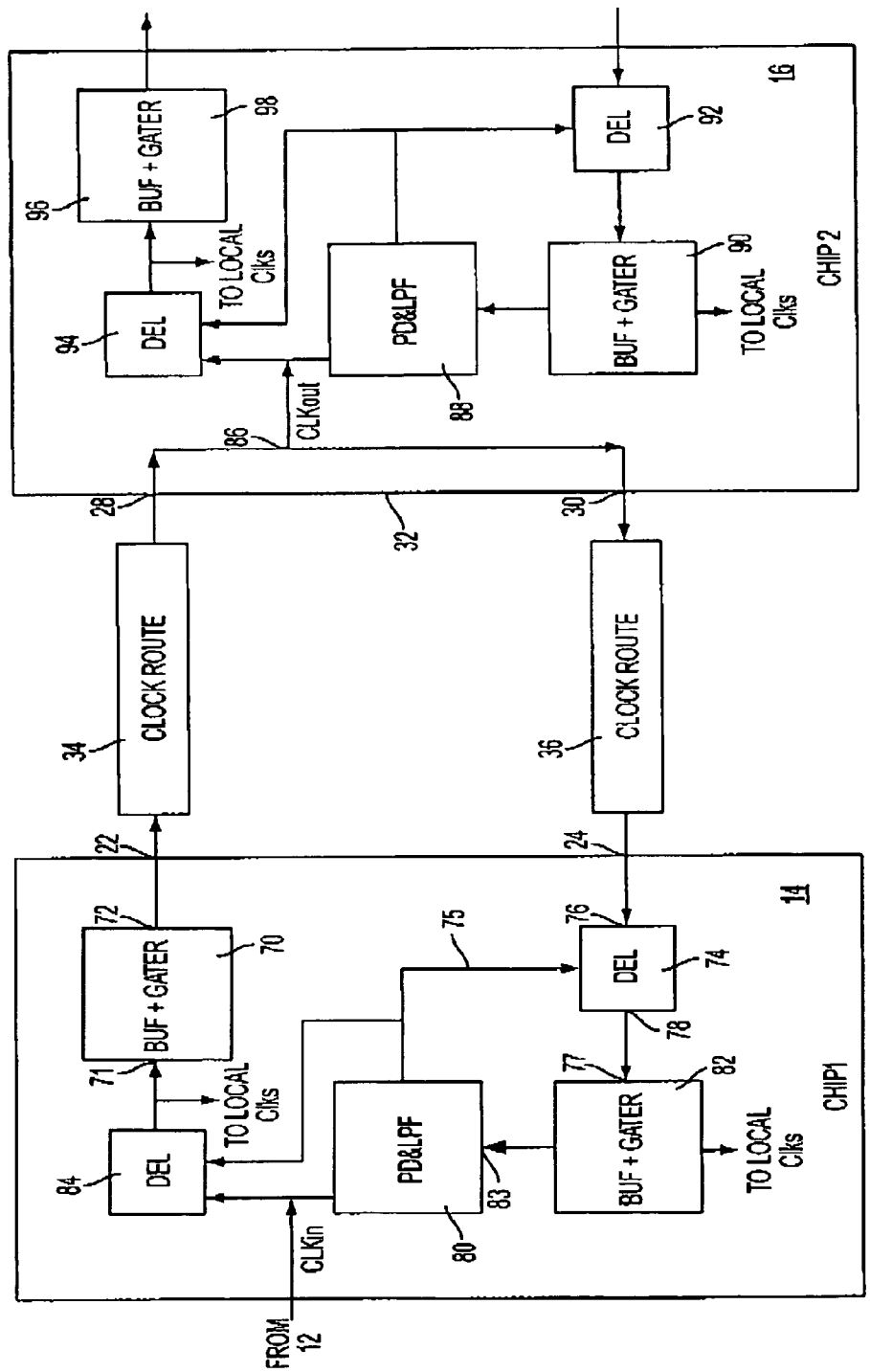
FIG. 2 is a block diagram including circuitry on a pair of the chips of FIG. 1 and the clock routes connecting the chips.
Figure 3:
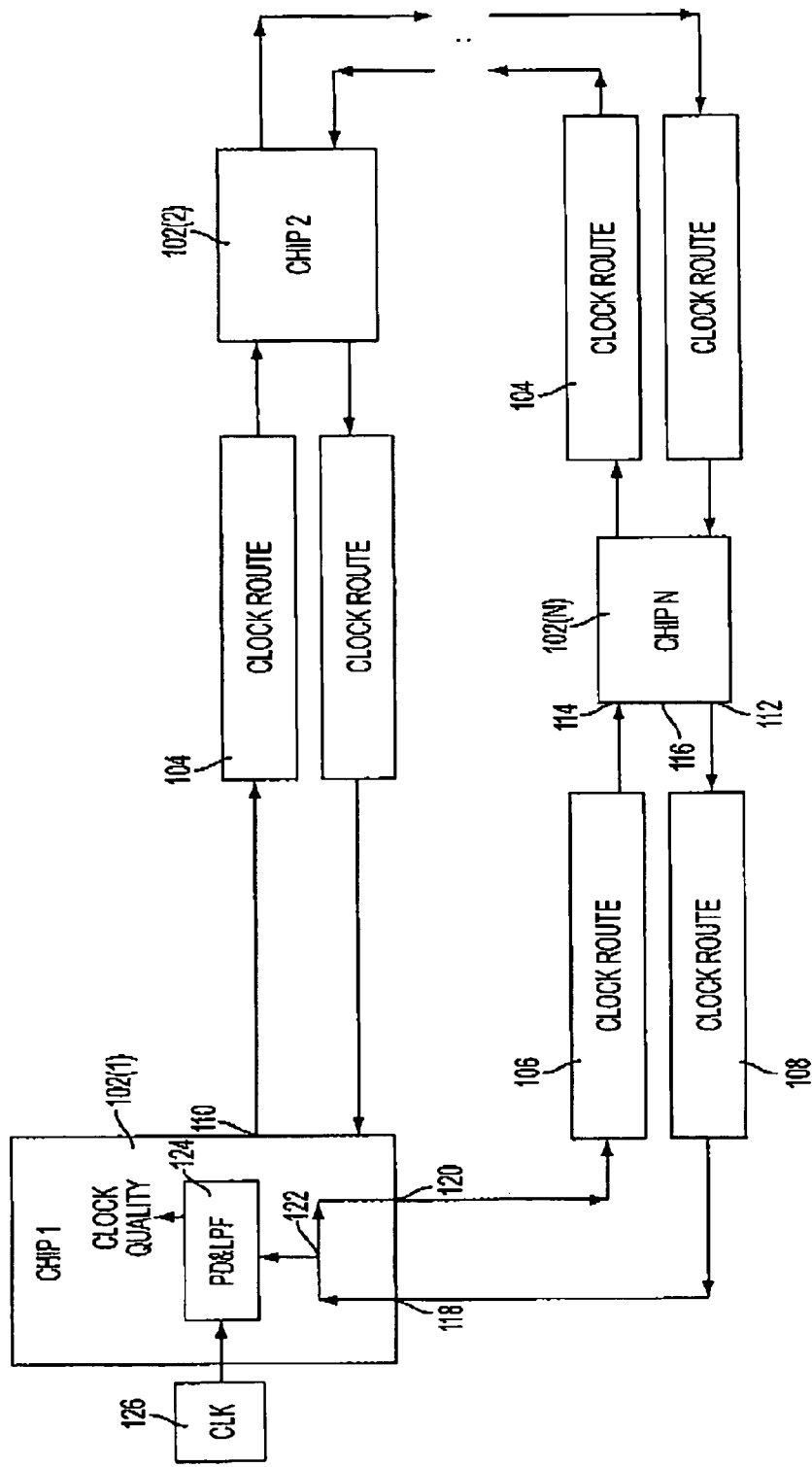
FIG. 3 is a block diagram of another embodiment of the invention, wherein N chips are carried by a printed circuit board and one of the chips includes circuitry for deriving an indication of clock quality.

Each of chips 14, 16, 18 and 20 includes integrated circuit clock circuitry similar to that illustrated in FIG. 2 or 3 of the previously-mentioned patent. Typically, at least one of chips 14, 16, 18 or 20 is a relatively large chip, for example, a microprocessor chip having edges that are two centimeters long, while at least one of the other chips is typically a small chip, such as an ASIC carrying a custom circuit. Each of chips 14, 16, 18 and 20 includes in proximity to opposite edges thereof clock circuitry for supplying clock waves to circuits within the chip. In addition, each large chip has several different regions driven by different clock waves that are synchronized with each other and may be phase displaced from each other by 90°, 180° or 270°. The clock circuitry adjacent the edges of chips 14, 16, 18 and 20 is connected to nearby peripheral terminals of the chip that are connected to balanced clock routes between adjacent pairs of chips.

Balanced clock routes connect adjacent first and second chips of a chip pair to each other, so that clock waves propagate in one direction from the first chip to the second chip and propagate in the other direction from the second chip to the first chip. Chip 14 includes terminals 22 and 24 and corresponding clock circuitry adjacent terminals 22 and 24, in close proximity to right edge 26 of chip 14. Chip 16 includes clock terminals 28 and 30 and corresponding clock circuitry in close proximity to left edge 32. The clock circuitry of chip 14 connected to terminal 22 supplies a clock wave to terminal 22, while the clock circuitry of the chip 16 in proximity to terminal 30 supplies a clock wave to terminal 30. Chip 14 includes clock receiving circuitry in close proximity to terminal 24, while chip 16 includes clock receiving circuitry in close proximity to terminal 28. Clock route 34 connects terminals 22 and 28 to each other, while clock route 36 connects terminals 24 and 30 to each other. The circuitry of chips 14 and 16 is such that clock waves in clock routes 34 and 36 propagate in opposite directions between chips 14 and 16.

Clock routes 34 and 36 are made of the same materials, are carried in same way by printed circuit board 10 in close proximity to each other, and have substantially the same geometry, i.e., length and cross-sectional shapes and dimensions. Hence, the clock wave propagation properties of clock routes 34 and 36 are substantially the same, despite local differences of the properties of chips 14 and 16, such as temperature, voltage, and processing differences. To assure that the clock waves respectively propagating to and from chip 14 via terminals 24 and 24 remain synchronized, chip 14 includes, in proximity to edge 26 and terminals 22 and 24, circuitry for maintaining a substantially fixed phase relationship between the clock wave that terminal 22 supplies to clock route 34 and the clock wave that clock route 36 supplies to terminal 24. Typically, the clock input of chip 14 is in a portion of chip 14 remote from terminals 22, 24 and edge 26. In the specifically illustrated embodiment, external source 12 is connected to terminals at the left edge of chip 14.

Balanced clock routes 38 and 40 connect clock terminals 42 and 44 in proximity to right edge 46 of chip 16 to terminals 50 and 52 on the left edge 54 of chip 18 in a manner similar to the manner discussed in connection with clock routes 34 and 36; similarly, balanced clock routes 54 and 56 connect terminals 58 and 60 on the right edge 62 of chip 18 to terminals 64 and 66 on the left edge 68 of chip 20. Balanced clock routes 38 and 40 are in close proximity to each other on printed circuit board 10 and have substantially the same geometry and the same materials; the same is true of balanced clock routes 54 and 56. Hence, each pair of balanced clock routes 34, 36 and 38, 40, as well as 54, 56 can be accurately considered as a balanced clock route pair.

Clock source 12 and chips 14, 16, 18 and 20 are arranged in sequence so the clock wave that source 12 supplies to chip 14 propagates from chip 14 to chip 16 via route 34, from chip 16 to chip 18, via route 38, and from chip 18 to chip 20 via route 54. Return routes 36, 40 and 56, and circuitry on chips 14, 16 and 18 enable the clocks on chips 14, 16, 18 and 20 to be synchronized. The lengths of the balanced routes between adjacent chip pairs influence the synchronized phase angle. The circuitry on each of chips 14, 16 and 18 for maintaining the synchronized relationship between the clock waves applied to and transmitted from the terminals along right edges 26, 46 and 62 of these chips is respectively in proximity to the right edges. Consequently, the clock waves on all of chips 14, 16, 18 and 20 are synchronized, so that the leading and trailing edges of clock waves have a constant phase relationship. The clock waves at the terminals along the right edges 26, 46 and 62 of chips 14, 16 and 18 are in phase with each other or are phase displaced from each other by any of 90°, 180° or 270°.

Reference is now made to FIG. 2 of the drawings, a block diagram of the circuitry on Chip 1 (14) and Chip 2 (16), as well as clock routes 34 and 36, for maintaining a synchronized relationship between the clock waves of Chip 1 (14) and Chip 2 (16), at terminals 22 and 24, so that the clock waves at these terminals have a synchronized phase relationship.

The clock circuitry in proximity to the left edge 23 of Chip 1 (14), where the clock wave from clock source 12 is introduced or derived, includes voltage controlled delay circuit 84. Circuit 84 has a clock input terminal connected to be responsive to the clock source and a clock output terminal that supplies the clock wave delayed by circuit 84 to a clock input of buffer and gater 70, constructed as described in the previously mentioned patent. The clock circuitry in proximity to edge 23 also includes phase detector and low pass filter circuit 80, and voltage controlled delay circuit 74, as well as buffer and gater 82. Buffer 70 has a clock output terminal connected to supply a clock wave to a clock input terminal of circuit 74, having a clock output terminal connected to drive a clock input terminal of buffer 82. Phase detector 80 has first and second clock input terminals, respectively connected to be responsive to the clock waves of clock source 12 and at the output terminal of buffer and gater 82. Detector 80 responds to the clock waves at the first and second clock input terminals thereof to derive a DC signal voltage having an amplitude and polarity respectively indicative of the magnitude and direction of the relative phase angles of the clock waves derived from clock source 12 and buffer 82. Detector 80 supplies the DC signal voltage it derives to control input terminals of delay circuits 84 and 74 to increase and decrease the delay times of circuits 84 and 74, relative to nominal delay values thereof. The output of detector 80 thus maintains the phases of the clock outputs of clock source 12 and buffer 82 synchronized at a predetermined phase angle 90°, 180°, 270° or 360°, to maintain phase synchronization for the clock outputs of circuitry 84, 70, 74, and 82.

Typically Chip 1 (14) includes several cascaded subsequent sections with clock circuitry the same as described in connection with circuit elements 84, 70, 80, 74, and 82. In such cases, the clock output of buffer 70 functions the same as the clock wave of clock source 12 to drive clock inputs of the subsequent sections. Thus, the output of buffer 70 drives (1) a delay circuit corresponding to delay circuit 84 and (2) a phase detector and low pass filter corresponding to phase detector and low pass filter 80. For convenience these subsequent sections are not illustrated, except for the last section. In the subsequent discussion, the output of circuit 70 is assumed to be connected to the last section of Chip 1 (14) in the same way the clock source 12 is connected to the first section.

The clock circuitry of the last section of Chip 1 (14) includes, in proximity to terminals 22 and 24 and edge 26, buffer and gater circuit 70. Circuit 70 includes logic circuitry for selectively coupling clock waves to circuitry on Chip 1 (14) in proximity to buffer and gater 70. In addition. buffer and gater circuit 70 includes output terminal 72 which is in proximity to and connected to terminal 22, which is essentially on edge 26. Buffer and gater 70 has a clock input terminal 71 connected to be responsive to a clock wave at output terminal 73 of voltage controlled delay circuit 75, located in proximity to buffer and gater 70. Circuit 75 has a clock input terminal 77 responsive to a clock wave derived on a portion of Chip 1 (14) upstream of and in proximity to circuit 75 and ultimately in response to the clock wave from clock source 12. In the illustrated circuit of Chip 1 (14), the output of buffer and gater 27 is connected to clock input terminal 77 of voltage controlled delay circuit 75.

Chip 14 carries, in close proximity to buffer and gater 70, voltage controlled delay circuit 74, having a clock input terminal 76 connected to and in close proximity to terminal 24, so terminal 76 and circuit 74 are responsive to the clock wave at terminal 24. Chip 14 includes circuitry for supplying delay elements 74 and 75 with a variable voltage which controls the delay that circuits 74 and 75 introduce between the clock input and output terminals thereof, e.g. input terminal 76 and output terminal 78 of circuit 74. Chip 14 supplies to delay circuit 74 a control signal that is influential in maintaining synchronism between the clock waves at terminals 22 and 24. Because the clock wave transmitted from terminal 22 to chip 16 and the clock wave transmitted from chip 16 back to terminal 24 are synchronized and routes 34 and 36 are balanced, i.e., affect the propagation of the clock waves transmitted through the routes in the same way, the clock waves on chips 14 and 16 are synchronized.

To maintain synchronism between the clock waves at terminals 22 and 24, Chip 1 (14) includes phase detector and low pass filter 80, having a first clock input terminal responsive to a clock wave that ultimately is derived on chip 14 in response to an output of source 12. In the illustrated circuit, terminal 81 is connected to the clock output of buffer and gater 27. Chip 14 includes the previously described circuitry for maintaining synchronization between the output of clock source 12 and the clock input of detector and filter 80 at the first clock input terminal. Detector and filter 80 has a second clock input terminal 83 responsive to the clock wave at the output terminal of buffer and gater 82, having an input terminal connected to be responsive to the dock wave that voltage controlled delay circuit 74 supplies to terminal 78.

Phase detector and lowpass filter 80 responds to the clock input thereof at the output of circuits 27 and 82 to derive a DC voltage having a magnitude and polarity respectively indicative of the difference in the phase angle of the clock waves supplied to it and the phase lead/lag relationship between the clock waves supplied to it. The resulting DC output signal of circuit 80 is applied to control input terminals of voltage control delay elements 74 and 75. Delay element 75 has a clock output that drives circuitry of chip 14 in close proximity to delay element 75. The circuitry of chip 14 that element 75 drives includes buffer and gater 70, which in turn drives terminal 22.

The clock wave that buffer and gater 70 supplies to terminal 22 propagates to terminal 28 of Chip 2 (16) via dock route 34. The clock wave that route 34 applies to terminal 28 drives clock circuitry in a first stage of Chip 2 (16) that is similar to the first stage of Chip 1 (14). In particular, a first stage of Chip 2 (16) includes phase detector and lowpass filter 88, buffer and gater circuit 90, voltage controlled delay circuits 92 and 94 as buffer and gater 96, that respectively correspond to detector 80, buffer and gater 82, delay circuits 74 and 84 and buffer and gater 70. Hence, Chip 2 (16) responds to the clock wave at terminal 28 in the same way that Chip 1 (14) responds to the clock wave from clock source 12 and the clock output of route 34 is the clock input of Chip 2 (16).

To enable the synchronization between the clock waves of chips 14 and 16 to be attained, chip 16 includes a lead between terminals 86 and 30, so that the clock wave at the output of route 34 drives route 36. Because of a symmetrical spatial relationship between the leads of chip 16 between terminals 28 and 30, the balanced nature of clock routes 34 and 36, and the controlled delay of element 74, synchronism is maintained between the clock waves at terminals 22 and 28 of chips 14 and 16.

Chip 2 (16) can, but does not necessarily, include several additional cascaded stages, one of which is illustrated as being the same as (1) the last stage of Chip 1 (14) and (2) the same as the first stage of Chip 2 (16), except that the last stage of Chip 2 (16) includes buffer and gater 98 that drives clock route 40 via terminal 46 and voltage controlled delay 99 that responds via terminal 44 to the output of clock 38. It is to be understood that if Chip 2 (16) is so small that it includes only a single stage so buffer and gater 98 and delay circuit 99, as well as the other circuits of the illustrated last stage are omitted, the output of buffer and gater 96 is connected directly to terminal 42 and the input of delay circuit 92 is connected directly to terminal 44.

Reference is now made to the block diagram of FIG. 3, which is similar in many respects to FIG. 1. FIG. 3 includes printed circuit board 100 having sequentially connected integrated circuit chips 102(1), 102(2) . . . 102(N). Adjacent pairs of chips 102 are connected to each other by balanced clock routes 104, such that route 104(i) is connected between chips 102(i) and chips 102(i+1), where i is selectively each of 1, 2, . . . (N−1). In addition, chip 102(N) is connected to clock quality circuitry on chip 102(1) by balanced clock routes 106 and 108. Clock routes 104 connect adjacent pairs of chips 102(1), 102(2) . . . 102(N) together so that a clock wave derived at output terminal 110 of chip 102(1) sequentially propagates to output terminals 112 on the output sides of chips 102(2) . . . 102(N). The clock circuitry on each of chips 102(1), 102(2) . . . 102(N) is similar to that illustrated and described in connection with FIG. 2. Hence, there is sequential coupling of the clock wave at terminal 110 to chips 102(2) . . . 102(N).

The connections between terminals 112 and 114 on the left edge 116 (i.e., the output edge) of chip 102(N) and terminals 118 and 120 of chip 102(1) are via balanced clock routes 106 and 108. Consequently the clock wave at terminal 112 of chip 102(N) is supplied to terminal 122 of chip 102(1). The clock wave at terminal 122 is supplied in parallel to one input of phase detector and lowpass filter 124 and to terminal 120. The clock wave at terminal 122 bears a predetermined phase relationship to the clock wave at terminal 112 of chip 102(N) because of the known length and propagation properties of balanced routes 106 and 108 and the synchronization that chip 102(N) provides for the clock waves at terminals 112 and 114. A second input of phase detector and lowpass filter 124 is responsive to the clock wave which drives the entire arrangement of printed circuit board 100, as derived from source 126 for example. Because of these circuit connections and the predetermined relationship between the clock waves at terminals 112 and 122, phase detector and lowpass filter 124 derives an output signal, in the form of a DC voltage, having a magnitude and polarity indicative of the phase difference of the inputs of the phase detector and lowpass filter and the lead/lag relationship of these inputs. The magnitude of the output voltage of phase detector and lowpass filter 124 provides a measure of the clock quality of the clock circuitry of the printed circuit chips 102(1), 102(2) . . . 102(N) and the clock routes 104 connecting them. In the arrangement of FIG. 3, the output of detector and filter 124 performs no feedback function and all synchronization between chips 102 is maintained by the circuitry on the individual chips and the balanced routes.

Figure 4:
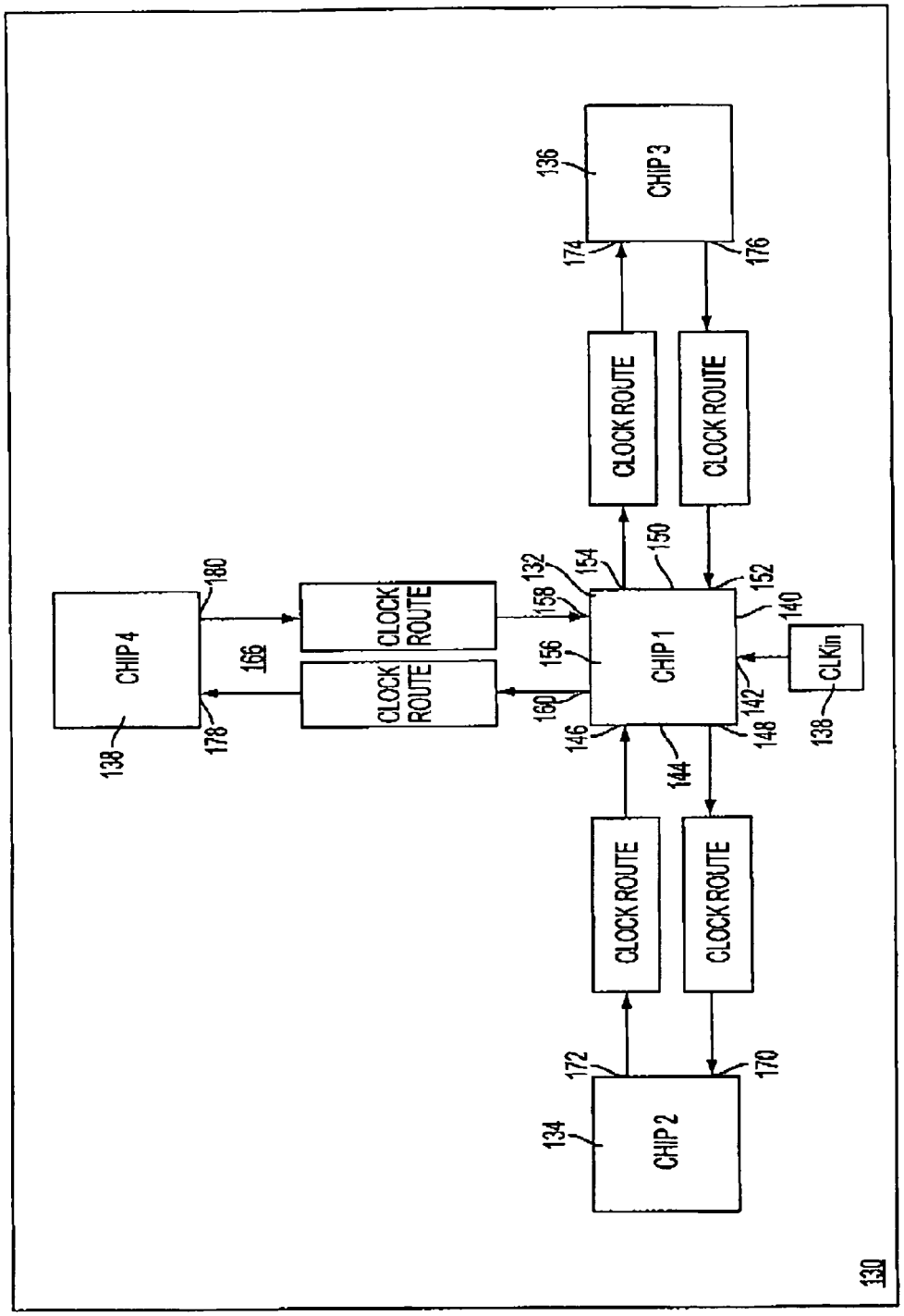
FIG. 4 is a block diagram of a printed circuit board carrying four chips connected to each other in a star configuration with clock routes between the chips.

In the embodiment of FIG. 4, printed circuit board 130 carries integrated circuit chips 132, 134, 136 and 138, having clock circuits connected to each other in a star configuration. Chip 132 is at the center of the star, while chips 134, 136 and 138 are at the corners of the star. Edge 140 of chip 132 includes input terminal 142, connected to the output of clock source 138. Chip 140 includes edge 144 that is at a right angle to edge 140 and which carries input and output terminals 146 and 148. Chip 140 also includes edge 150 that is opposite to edge 144; edge 150 carries input and output terminals 152 and 154. Edge 156 of chip 132, opposite edge 140, includes input and output terminals 158 and 160. The input and output terminals along each of edges 144, 150 and 156 of chip 132 have connections similar to the connections and circuitry of chip 14, FIG. 2, along edge 26 thereof. In other words, terminals 146 and 148 are connected to circuitry in chip 132 that is similar to the circuitry to which terminals 22 and 24 are connected in FIG. 2. The same relationship exists for the terminals in circuitry connected to and in proximity to edges 150 and 156 of chip 132.

The terminals along edges 144, 150 and 156 of chip 132 are respectively connected to chips 134, 136 and 138 by balanced clock route pairs 162, 164 and 166, constructed as described supra in connection with the clock route pair formed by clock routes 34 and 36. Clock route pair 162 causes clock waves to be transmitted from terminal 148 of chip 132 to terminal 168 of chip 134 and from terminal 172 of chip 134 to terminal 146 of chip 132. Chip 134 includes clock circuitry connected to terminals 170, 172 and similar to the clock circuitry of chip 16 that is associated with edge 132 and connected to terminals 28 and 30. Chip 136 includes terminals 174 and 176; terminal 174 is responsive to the clock wave from terminal 154 and terminal 176 supplies a clock wave to terminal 152 via clock route pair 164. The circuitry of chip 136 connected to terminals 174 and 176 is essentially the same as the circuitry of chip 16 that is connected to terminals 28 and 30. The same is true of the clock circuitry of chip 138 that is connected to terminals 178 and 180; terminal 178 is responsive to the clock wave at terminal 160 and terminal 180 supplies a clock wave to terminal 158.

Figure 5:
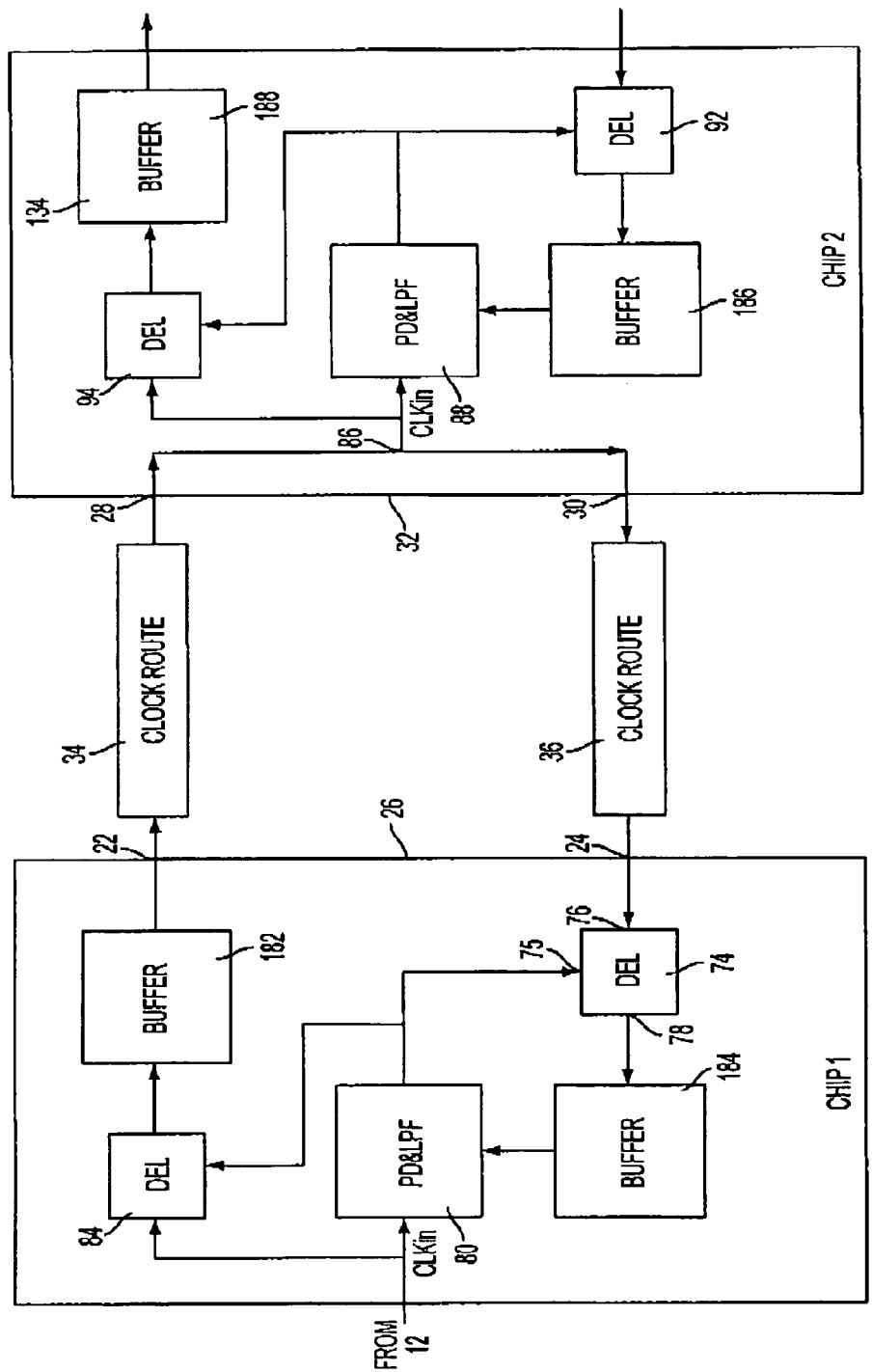
FIG. 5 is a block diagram similar to the block diagram of FIG. 2, but wherein the chips are connected to the clock routes by buffer circuits, rather than buffer and gater circuits.

In FIG. 5, buffer circuits 182, 184, 186 and 188 replace buffer and gater circuits 70, 82, 90 and 98 of FIG. 2. Thus, the circuit of FIG. 5 herein is similar to FIG. 5 of the previously mentioned patent, while the circuitry of FIG. 2 herein is similar, in certain respects, to the circuitry of FIG. 4 of the previously mentioned patent. However, in each of FIGS. 2 and 5 of the present application, balanced routing is provided between adjacent integrated circuits, while no routing is provided in the node circuitry of FIG. 4 of the previously mentioned patent. While balanced routes are included in the circuit of FIG. 5 of the previously mentioned patent, the routes are carried by a single integrated circuit chip, and are not connected between adjacent chips, such as on a printed circuit board.

Figure 6:
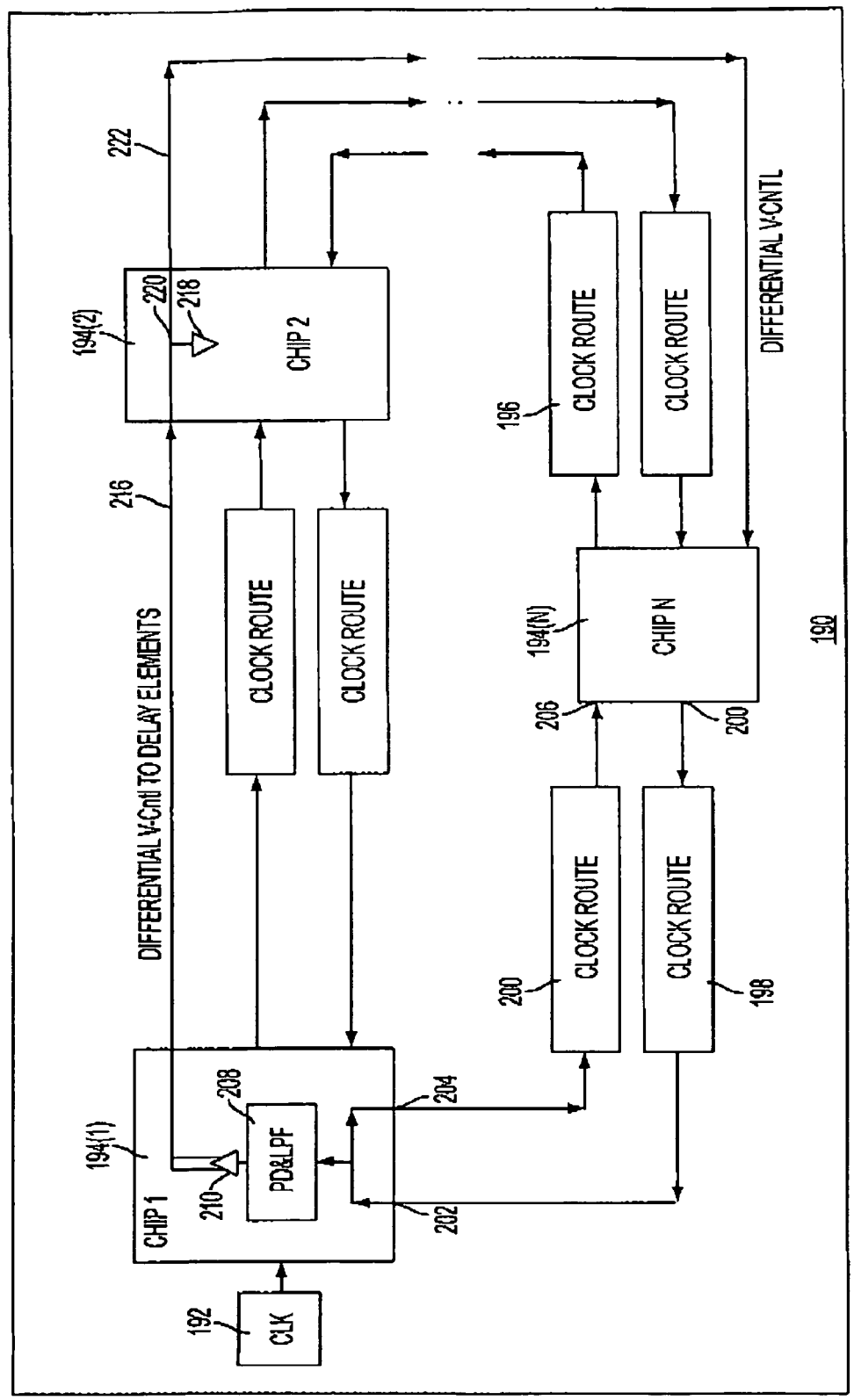
FIG. 6 is a block diagram of a printed circuit board carrying N chips connected to each other in a feedback arrangement which derives a signal for controlling synchronization of all the chips on the printed circuit board.

Reference is now made to FIG. 6 of the drawing, wherein printed circuit board 190 is illustrated as carrying clock source 192 and integrated circuit chips 194(1), 194(2) . . . 194(N). Balanced clock routes 196 connect adjacent pairs of chips 194(1), 194(2) . . . 194(N) together in a manner similar to that described supra in connection with FIG. 3. In addition, printed circuit board 190 includes a balanced route pair comprising clock routes 198 and 200. Clock route 198 connects output terminal 199 of chip 194(N) to clock input terminal 202 of chip 194(1), while clock route 200 connects output terminal 204 of chip 194(1) to input terminal 206 of chip 194(N).

Chip 194(1) includes phase detector and lowpass filter 208, having one input connected to be responsive to the clock output of source 192 and a second input connected to be responsive to the clock wave at terminal 202. The connection between the second input of phase detector and lowpass filter 208 and terminal 202 is via terminal 210, which is connected to terminal 204. Phase detector and lowpass filter 208 derives an output signal having a magnitude and polarity determined by the difference in phase angle between the clock wave inputs thereof and the lead/lag phase relationship between them. The output signal of phase detector and lowpass filter 208 drives an input of operational amplifier 210, having a pair of complementary output terminals 212 and 214 on which are derived opposite polarity DC signal voltages that are directly proportional to the DC output voltage of phase detector and lowpass filter 208.

The opposite polarity signal voltages at terminals 212 and 214 are supplied via common mode line 216 from chip 194(1) to chip 194(2), thence to chips 194(3) (not shown), . . . 194(N). Because line 216, that can be considered as a signal transmission circuit element for coupling a control signal from chip 194(1) to other chips 194(2) . . . 194(N) on printed circuit board 190, is a common mode line, i.e., a line including two leads in close proximity to each other and carrying complementary phased signals, any noise or other anomalies introduced into the signal on one of the lines is introduced in the same manner on the other line. Because the signals are complementary to each other, the anomalies cancel when the signals are detected by conventional common mode differential amplifier circuitry 218 of chip 194(2).

Differential amplifier 218 derives a single DC signal voltage having an amplitude and polarity equal to the amplitude and polarity of the output of phase detector and lowpass filter 206 on chip 194(1). The output signal voltage of differential amplifier 218 is applied to voltage controlled delay circuits in chip 194(2) to provide synchronism for the clock waves propagating in opposite directions between chips 194(1) and 194(2) via balanced clock route pair 196.

Each of chips 194 includes common mode line 220 that extends from one edge of the chip to the other. Common mode line 220 of chip 194(2) is connected to common mode line 222 that extends from chip 194(2) to chip 194(3) (not shown). Because each of chips 194(2) . . . 194(N) includes a common mode line (similar to common mode line 220) and common mode detection circuitry, in the form of a differential amplifier (similar to amplifier 218) each of chips 194(2) . . . 194(N) derives a DC voltage having substantially the same amplitude and polarity as the output of filter and detector 208 of chip 194(1). The DC voltages of chips 194(2) . . . 194(N) are not substantially affected by local properties of printed circuit board 190 or the chips that are carried by circuit board 190. Thus, synchronized phase relationship is provided on each of chips 194(1), 194(2) . . . 194(N). The synchronized relationship can be provided even for those chips which may not have circuitry for monitoring the phase difference between the clock wave inputs and outputs thereof. In other words, some of chips 194(2) . . . 194(N) may include only voltage delay circuits that are responsive to the phase error signal that phase detector and lowpass filter 206 supplies to common mode line 216 by way of amplifier 210.

Figure 7:
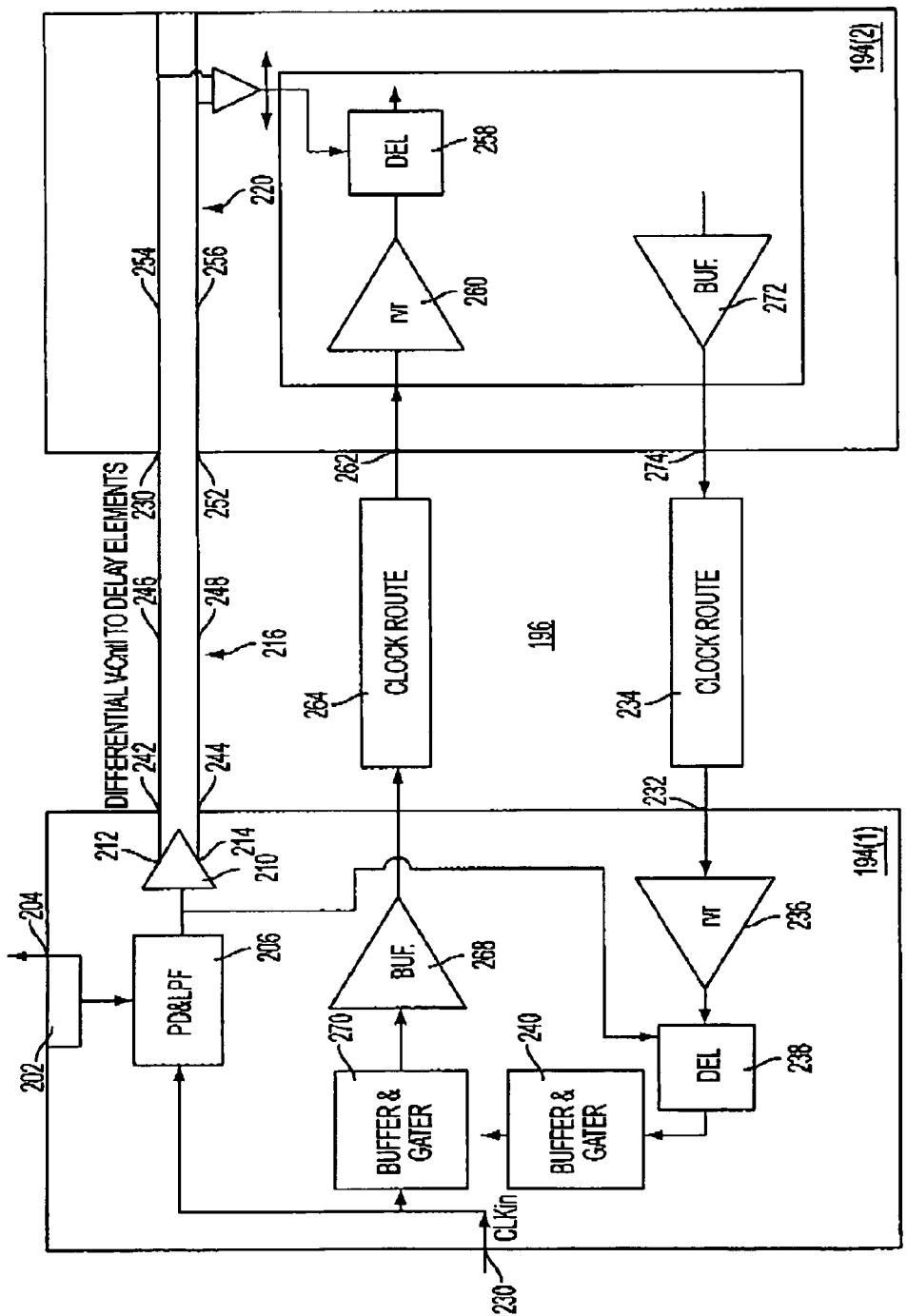
FIG. 7 is a block diagram including circuitry on a pair of the chips of FIG. 6 and the clock routes connecting the chips.

Reference is now made to FIG. 7 of the drawing, a more detailed block diagram of some of the circuitry that chips 194(1) and 194(2) include. To simplify the drawing, chips 194(1) and 194(2) are illustrated as including only one stage on each chip; it is to be understood that the chips typically include plural cascaded stages as described in connection with FIG. 2. As illustrated in FIG. 7, chip 194(1) includes clock input terminals 230 and 232, respectively connected to be responsive to clock waves from clock wave source 192 and clock route 234 of balanced clock route pair 196. Chip 194 includes clock receiver circuit 236, having an input connected to be responsive to the clock wave at terminal 232 and an output for driving local clock circuits on chip 194(1). Chip 194(1) also includes voltage controlled delay circuit 238, having a control input signal terminal responsive to the phase indicating DC output voltage of phase detector and lowpass filter 206. Voltage controlled delay circuit 238 has an output connected to buffer and gater circuit 240 that drives other local clock circuits on chip 194(1). There is no connection between the clock wave circuitry responsive to the clock wave at terminal 232 and inputs of the clock wave control circuitry of chip 194(1).

Phase detector and lowpass filter 206 responds to the clock input from source 192, as applied to terminal 230, as well as the clock wave from chip 194(N), as coupled through clock route 198, FIG. 6. Phase detector and lowpass filter 206 responds to the phase difference between inputs from source 192 and clock route 198 to supply a variable amplitude and polarity DC voltage to the input of amplifier 210. Amplifier 210 drives output signal terminals 242 and 244 of chip 194(1) with control signal voltages that are of opposite polarity.

Terminals 242 and 244 are respectively connected to leads 246 and 248 on printed circuit board 190; leads 246 and 248 comprise common mode line 216. Leads 246 and 248 are made of the same material, are in close proximity to each other, have the same geometry and are carried in the same way by printed circuit board 190. Hence, variations in temperature and other anomalies, such as noise, have the same effect on the voltages on lines 246 and 248. Lines 246 and 248 are respectively connected to terminals 250 and 252 of chip 194(2). Terminals 250 and 252 are respectively connected to leads 254 and 256 of common mode line 220 of chip 194(2).

Chip 194(2) includes differential amplifier 218 that functions as a common mode receiver, to derive a DC signal voltage that is not influenced by temperature variations and other anomalies, such as noise, on leads 246 and 248. Differential amplifier 218 supplies a DC signal voltage having an amplitude and polarity equal to the amplitude and polarity of the output of phase detector and lowpass filter 206.

The output of differential amplifier 218 is applied to voltage controlled delay circuit 258, included in a balanced circuit of chip 194(2). Delay circuit 258 has a clock input, connected to be responsive to the output of clock wave receiver 260, included on chip 194(2). Receiver 260 is connected to be responsive to the clock input terminal 262 of chip 194(2). Terminal 262 is connected to be responsive to the clock wave that clock route 264 of balanced route pair 196 transmits in response to the clock output of chip 194(1) at terminal 266. Terminal 266 is connected to be responsive to the output of buffer amplifier 268 of chip 194(1); buffer amplifier 268 has an input connected to be responsive to the clock wave of chip 194(1) as, for example, derived by buffer and gater 270, having an input responsive to the clock wave of source 192.

The balanced circuit of chip 194(2) includes buffer 272, having an input from clock circuitry (not shown) on chip 194(2). Buffer 272 has an output connected to drive terminal 274 of chip 194(2). Terminal 274 supplies a clock wave to clock route 234 which drives terminal 232 of chip 194(1).

From the foregoing, delay elements on chips 194(1) and 194(2) are responsive to the phase error indicating output signal of phase detector and lowpass filter 206 to provide synchronization for the clock waves on chips 194(1) and 194(2). Similarly, synchronization is provided on each of the chips of printed circuit board 190, without local feedback. This is contrary to the arrangements of FIGS. 1–5, where synchronization of the clock waves on the different integrated circuits chips is attained as a result of separate feedback circuits on each of the chips and the balanced routes connecting the chips.

While there have been described and illustrated specific embodiments of the invention, it will be clear that variations in the details of the embodiments specifically illustrated and described may be made without departing from the true spirit and scope of the invention as defined in the appended claims.

The invention claimed is:

1. In combination, plural integrated circuit chips, clock circuitry for supplying synchronized clock waves to loads on the plural integrated circuit chips, the clock circuitry being on the chips and adapted to be responsive to a source of clock waves, the clock circuitry being arranged for coupling the synchronized clock waves to regions of the plural chips, first and second routes for the clock waves between pairs of the chips, the first and second routes and the chips being arranged so there is a first clock wave route in a first direction from a first chip of a particular pair to a second chip of that particular pair, and a second clock wave route in a second direction from the second chip of the particular pair to the first chip of the particular pair, the first and second routes having substantially the same geometry and being in close proximity to each other so they have substantially the same effects on clock waves propagating therein in opposite directions, and circuitry for maintaining a substantially constant phase relation between the clock waves transmitted to and from the first chip via the first and second routes.

2. The combination of claim 1 wherein the circuitry is on the first chip.

3. The combination of claim 1 wherein the circuitry is on a third chip and the circuitry is arranged for deriving a control signal for maintaining the substantially constant phase relation, and further including signal transmission circuit elements for coupling the signal from the third chip to the first and second chips.

4. The combination of claim 3 wherein the signal transmission elements include a common mode path for the control signal between the third chip and the first and second chips.

5. The combination of claim 4 wherein the circuitry includes a phase detector connected to be responsive to a clock wave on the third chip and a clock wave adapted to propagate from the third chip back to the third chip via routes between a plurality of the chips.

6. The combination of claim 5 wherein the circuitry for maintaining a substantially constant phase relation includes variable delay circuits for the clock waves, the variable delay circuits being arranged to be responsive to the signal on the common mode path.

7. The combination of claim 3 wherein the circuitry includes a phase detector connected to be responsive to a clock wave on the third chip and a clock wave adapted to propagate from the third chip back to the third chip via routes between a plurality of the chips.

8. The combination of claim 7 wherein the circuitry for maintaining a substantially constant phase relation includes variable delay circuits for the clock waves, the variable delay circuits being arranged to be responsive to the signal on the common mode path.

9. The combination of claim 1 wherein the circuitry includes a phase detector connected to be responsive to a clock wave on the first chip and a clock wave adapted to propagate from the first chip back to the first chip via routes between a plurality of the chips.

10. The combination of claim 9 wherein the circuitry for maintaining a substantially constant phase relation includes variable delay circuits for the clock waves, the variable delay circuits being arranged to be responsive to a signal derived by the phase detector indicative of the differences in phase of the clock waves connected to drive the phase detector.

11. The combination of claim 1 further including circuitry for determining the phase difference between the clock wave supplied to one of the plural integrated circuit chips and clock waves adapted to propagate from the one chip to additional chips connected to be sequentially responsive to the clock wave derived from the one chip.

12. The combination of claim 11 wherein the circuitry for determining is arranged to derive an error signal, a path for the error signal to at least some of the chips, the chips having (a) connections to the path for the error signal and (b) a variable delay element arranged to have a delay time adapted to be controlled by the error signal.

13. The circuitry of claim 11 wherein the circuitry for determining is arranged to derive an output signal having a value indicative of clock quality, said clock quality signal having no control effect on the plural integrated circuit chips.

14. The combination of claim 1 wherein the plural chips are connected to each other in sequence and arranged for causing the clock waves to propagate via said routes in sequence from chip i to chip (i+1) via route i, where i is sequentially 1 . . . (N−1) and N is the number of chips.

15. The combination of claim 1 wherein the chips are connected to each other via the routes so that the chips are connected in a star configuration.

16. The combination of claim 1 wherein the chips and routes are carried by a circuit board.

17. The combination of claim 1 wherein the chips are stacked on each other and the routes comprise vias in and between the chips.

* * * * *

UNITED STATES PATENT AND TRADEMARK OFFICE
CERTIFICATE OF CORRECTION

PATENT NO. : 7,120,815 B2  Page 1 of 1
APPLICATION NO. : 10/697297
DATED : October 10, 2006
INVENTOR(S) : Li Tsai It is certified that error appears in the above-identified patent and that said Letters Patent is hereby corrected as shown below:

In column 6, line 36, delete "dock" and insert -- clock --, therefor.

Signed and Sealed this

Twenty-third Day of December, 2008

JON W. DUDAS
*Director of the United States Patent and Trademark Office*